United States Patent
Sun et al.

(10) Patent No.: US 7,745,826 B2
(45) Date of Patent: Jun. 29, 2010

(54) THIN FILM TRANSISTOR SUBSTRATE, ELECTRONIC APPARATUS, AND METHODS FOR FABRICATING THE SAME

(75) Inventors: Ming-Wei Sun, Hsinchu County (TW); Chih-Wei Chao, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/249,968

(22) Filed: Oct. 13, 2008

(65) Prior Publication Data

US 2010/0019243 A1    Jan. 28, 2010

(30) Foreign Application Priority Data

Jul. 25, 2008   (TW)   ............... 97128473 A

(51) Int. Cl.
   *H01L 29/04* (2006.01)
(52) U.S. Cl. .................. 257/64; 438/150
(58) Field of Classification Search ........... 257/64; 438/150
   See application file for complete search history.

(56) References Cited

U.S. PATENT DOCUMENTS

| | | | |
|---|---|---|---|
| 5,407,846 A | 4/1995 | Chan | |
| 6,177,301 B1 | 1/2001 | Jung | |
| 6,521,473 B1 | 2/2003 | Jung | |
| 6,894,313 B2 | 5/2005 | Park et al. | |
| 7,160,763 B2 | 1/2007 | Im et al. | |
| 7,183,574 B2 | 2/2007 | Kang et al. | |
| 2001/0001745 A1 | 5/2001 | Im et al. | |
| 2006/0255338 A1 | 11/2006 | Jeong et al. | |

FOREIGN PATENT DOCUMENTS

| | | |
|---|---|---|
| CN | 101038935 | 9/2007 |
| TW | 538544 | 6/2003 |
| TW | 580732 | 3/2004 |
| TW | I240950 | 10/2005 |
| TW | I285434 | 8/2007 |

OTHER PUBLICATIONS

"1st Office Action of China counterpart application", issued on Apr. 24, 2009, p. 1-p. 6.
"2nd Office Action of China counterpart application", issued on Jul. 17, 2009, p. 1-p. 5.

*Primary Examiner*—Zandra Smith
*Assistant Examiner*—Paul E Patton
(74) *Attorney, Agent, or Firm*—Jianq Chyun IP Office

(57) ABSTRACT

A TFT substrate includes a substrate and at least a TFT disposed thereon. The TFT includes a semiconductor island and at least a gate. The semiconductor island has a source region, a drain region, and a channel region interposed therebetween. The semiconductor island has sub-grain boundaries. The gate corresponds to the channel region. A first included angle between an extending direction of the gate and a line connecting the centroid of the source region with the centroid of the drain region is not substantially equal to 90 degrees. A second included angle between the sub-grain boundaries in the channel region and the line connecting the centroid of the source region with the centroid of the drain region is not substantially equal to 0 degree or 90 degrees. Additionally, a method of fabricating a TFT substrate, an electronic apparatus, and a method of fabricating the electronic apparatus are also provided.

9 Claims, 11 Drawing Sheets

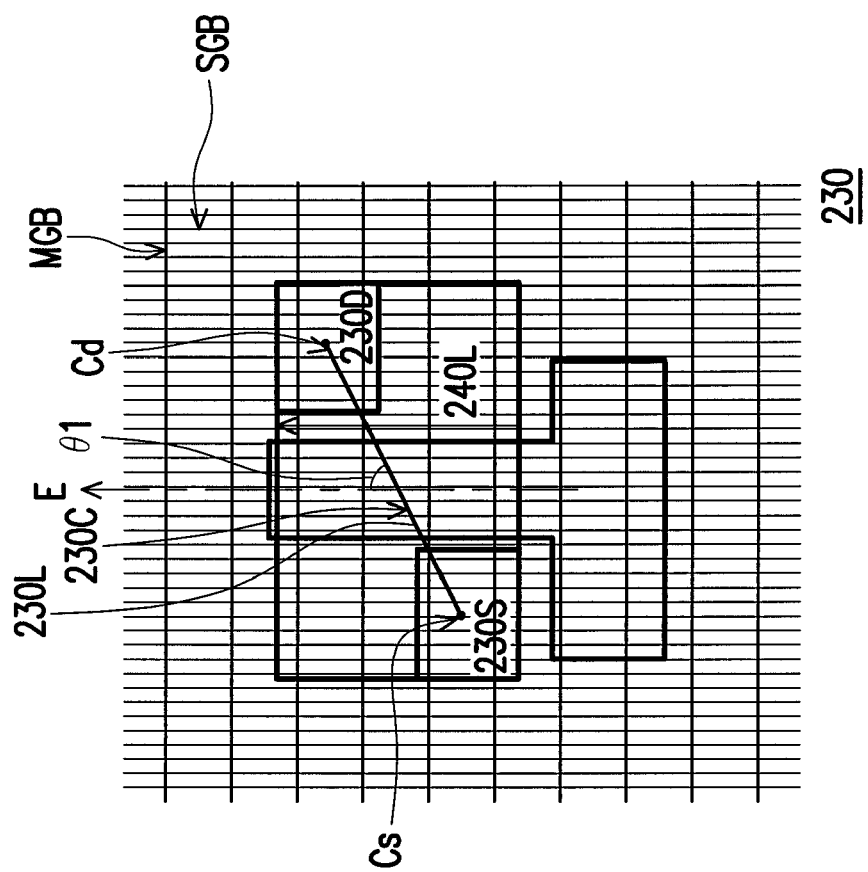
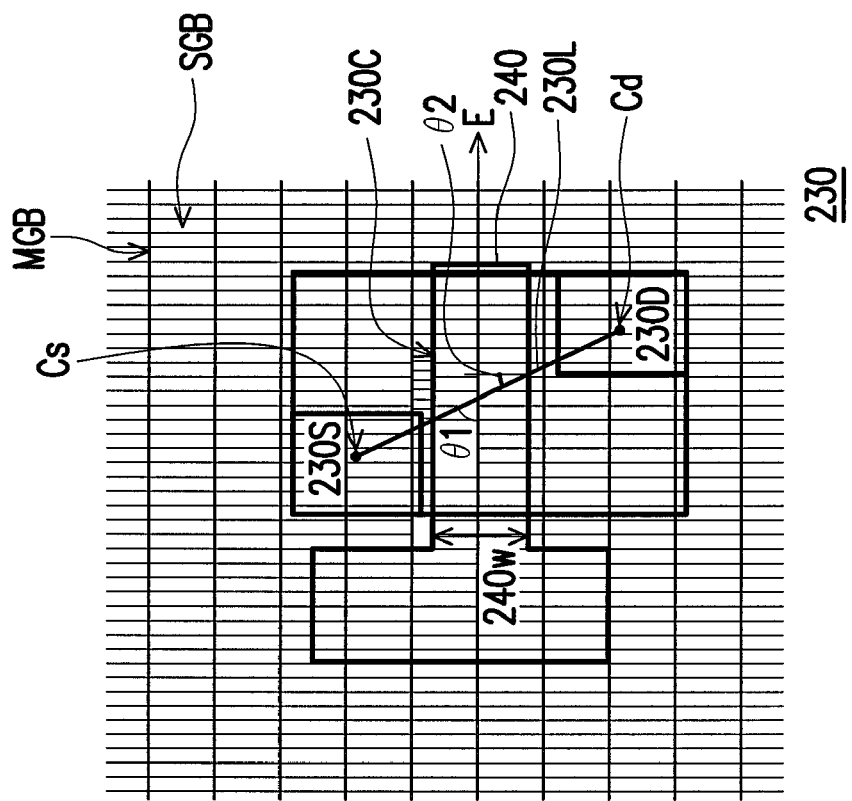
FIG. 4B
FIG. 4A

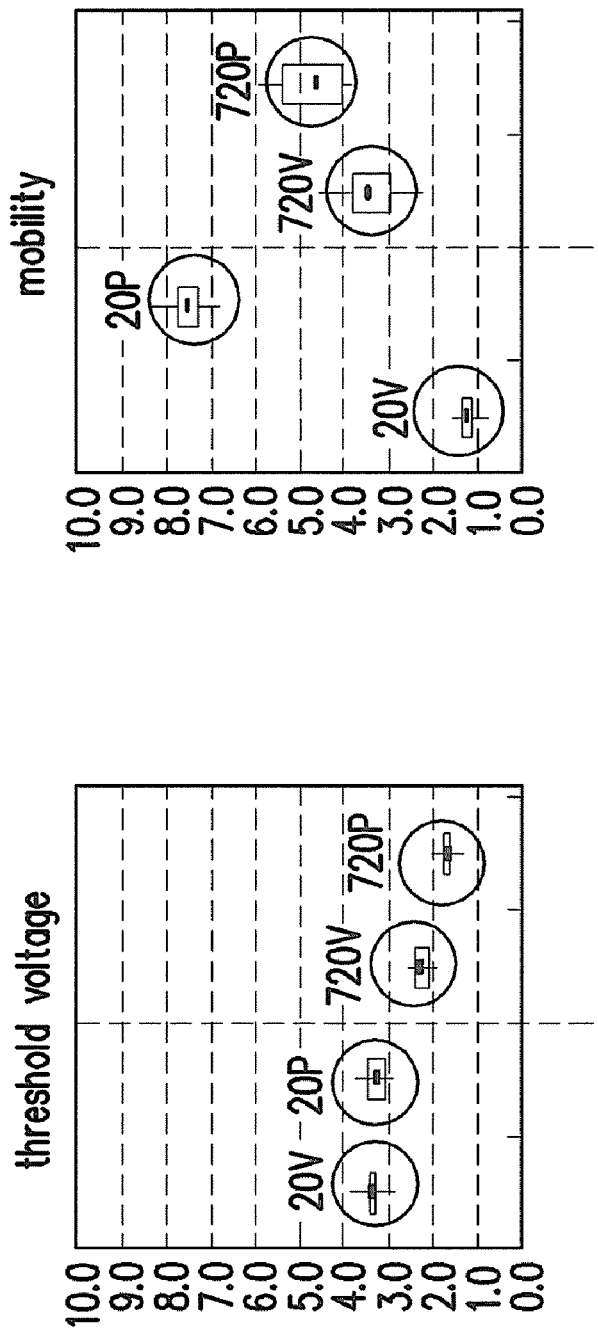

THIN FILM TRANSISTOR SUBSTRATE, ELECTRONIC APPARATUS, AND METHODS FOR FABRICATING THE SAME

CROSS-REFERENCE TO RELATED APPLICATION

This application claims the priority benefit of Taiwan application serial no. 97128473, filed on Jul. 25, 2008. The entirety of the above-mentioned patent application is hereby incorporated by reference herein and made a part of this specification.

BACKGROUND OF THE INVENTION

1. Field of the Invention

The present invention relates to a thin film transistor (TFT) substrate, an electronic apparatus, and methods for fabricating the same and, more particularly, relates to a TFT substrate in which a channel region has sub-grain boundaries and relates to an arrangement of the sub-grain boundaries, an electronic apparatus, and methods for fabricating the same.

2. Description of Related Art

Recently, with an advancement of optoelectronic technologies and semiconductor fabricating technologies, a flat panel displays have been vigorously developed. Among the flat panel displays, a liquid crystal displays (LCDs) characterized by low operating voltage, no harmful radiation, light weight, and compactness have gradually replaced conventional CRT displays and become mainstream display products.

In general, the LCD can be categorized into an amorphous silicon TFT-LCD and a low temperature polysilicon TFT-LCD. Compared with the amorphous silicon TFT, the low temperature polysilicon TFT has a relatively high electron mobility (by two to three orders of magnitude, and therefore the polysilicon TFT not only can serve as a switch of a pixel, but also can be applied in peripheral circuit regions as a circuit for driving the LCD.

Practically, the TFT acting as the switch of the pixel and the TFT acting as the driving circuit require different properties. The TFT serving as the switch of the pixel is normally required to achieve high uniformity of electrical characteristics, while the TFT acting as the driving circuit should be characterized by high mobility of carriers and high electrical reliability. Here, device characteristics of the TFT are closely associated with crystallization forms and crystallization locations in the polysilicon layer. In particular, electrical performance of the TFT mainly results from the crystallization form of the polysilicon layer in a channel region.

FIG. 1 is a schematic view of a conventional sequential lateral solidification (SLS) laser crystallization apparatus 100 for forming polysilicon. Please refer to FIG. 1, the SLS laser crystallization apparatus 100 includes a laser source (not shown), an optical system 110, and a substrate carrier 120, wherein the optical system 110 has a mask 112, and a modulator 114. The SLS laser crystallization apparatus 100 is an improvement of an excimer laser crystallization apparatus. Specifically, the highly-precise optical system 110 and the substrate carrier 120 capable of being moved within a sub-micro range for carrying a substrate 130 are additionally installed in the original excimer laser system.

FIG. 2A is a schematic view of a conventional SLS laser crystallization apparatus in which crystallization is being performed on a polysilicon layer. FIG. 2B is a schematic top view of the polysilicon layer fabricated by performing the crystallization as shown in FIG. 2A. Referring to FIG. 2A, through a mask design of a mask 112, laser beams penetrating slits S of the mask 112 are patterned and then emitted to an amorphous silicon layer 140 (α-Si shown in FIG. 1) on the substrate 130 via the modulator 114. Thereafter, referring to FIG. 2B, a polysilicon layer 150 (p-Si shown in FIG. 1) having a structure of periodic grain boundaries is formed by controlling regions of film sequential lateral solidification and grain boundary locations through the pattern design of the mask depicted in FIG. 2A. Here, the polysilicon layer 150 includes main grain boundaries (MGBs) and sub-grain boundaries (SGBs).

In general, the SGBs are often parallel to grain growing directions, while the MGBs are substantially perpendicular to the SGBs. Hence, when a line connecting the centroid of a source region with the centroid of a drain region is parallel to the SGBs, the carrier mobility in the channel region is improved. On the contrary, when the line connecting the centroid of the source region with the centroid of the drain region is parallel to the MGBs, the carriers are prone to be trapped in the SGBs, such that the carrier mobility in the channel region is reduced. In other words, the carrier mobility in the channel region is profoundly affected by the orientation of the MGBs and SGBs in the polysilicon layer having a highly anisotropic crystallization form.

However, to meet actual demands on partial layout of the TFT array substrate, the TFTs placed in various locations on the TFT array substrate may have the channel regions in different directions. For instance, the TFT disposed in a peripheral circuit region may have a different channel direction from that of the TFT disposed in a display region. In detail, the demand on layout of some of the TFTs disposed in the display region lies in that the directions of the channel regions in the TFTs are parallel to the MGBs of the polysilicon, while the demand on the layout of some of the TFTs disposed in the peripheral circuit region rests in that the directions of the channel regions in the TFTs are parallel to the SGBs of the polysilicon. Since the carrier mobility in the channel region is closely related to the crystallization form of the polysilicon, the anisotropic property of the polysilicon leads to variations in characteristics of the TFTs on the TFT array substrate, thereby deteriorating uniformity of electrical characteristics of the TFTs. As such, mura effects may be generated, and display quality is reduced.

SUMMARY OF THE INVENTION

The present invention is directed to a TFT array substrate by which uniformity of electrical properties can be improved.

The present invention is further directed to a method for fabricating a TFT array substrate. By applying said method, the TFT array substrate with uniform electrical properties can be formed.

The present invention is further directed to an electronic apparatus equipped with a TFT array substrate characterized by uniform electrical properties.

The present invention is further directed to a method for fabricating an electronic apparatus. By applying said method, the electronic apparatus with uniform electrical properties can be formed.

In the present invention, a TFT array substrate including a substrate and at least a TFT disposed on the substrate is provided. The TFT includes a semiconductor island and at least a gate. The semiconductor island has a source region, a drain region, and a channel region disposed between the source region and the drain region. Besides, the semiconductor island has a plurality of SGBs. The gate corresponds to the channel region. A first included angle between an extending direction of the gate and a line connecting the centroid of the source region with the centroid of the drain region is not substantially equal to 90 degrees. A second included angle between the SGB and the line connecting the centroid of the source region with the centroid of the drain region is not substantially equal to 0 degree or 90 degrees.

In the present invention, a TFT substrate including a substrate and at least a TFT disposed on the substrate is further provided. The TFT includes a semiconductor island and a gate. The semiconductor island has a plurality of SGBs. In addition, the semiconductor island includes a source region, a drain region, and a channel region disposed between the source region and the drain region. The length of the channel region is extended along a curve, and the width of the channel region remains substantially the same in an extending direction of the curve. The gate corresponds to the channel region.

In the present invention, a method for fabricating a TFT substrate is further provided. The method includes following steps. A substrate is provided at first. Next, at least a semiconductor island is formed on the substrate, and the at least a semiconductor island has a plurality of SGBs. Thereafter, a source region, a drain region, and a channel region disposed between the source region and the drain region are defined in the at least a semiconductor island. After that, at least a gate corresponding to the channel region is formed, so as to obtain a first included angle and a second included angle. The first included angle between an extending direction of the gate and a line connecting the centroid of the source region with the centroid of the drain region is not substantially equal to 90 degrees. The second included angle between the SGB in the channel region and the line connecting the centroid of the source region with the centroid of the drain region is not substantially equal to 0 degree or 90 degrees.

In the present invention, a method for fabricating a TFT substrate is further provided. The method includes following steps. A substrate is provided at first. Next, at least a semiconductor island is formed on the substrate, and the at least a semiconductor island includes a plurality of SGBs. Thereafter, a source region, a drain region, and a channel region located between the source region and the drain region are defined in the at least a semiconductor island. The length of the channel region is extended along a curve, and the width of the channel region remains substantially the same in an extending direction of the curve. Afterwards, at least a gate corresponding to the channel region is formed.

In the present invention, an electronic apparatus including a display panel and an electronic component connected to the display panel is further provided. Here, the display panel includes the TFT substrate discussed hereinbefore.

In the present invention, a method for fabricating an electronic apparatus is further provided. The method includes steps of providing a display panel and an electronic component connected to the display panel. Here, a method for fabricating the display panel includes a method for fabricating the TFT substrate discussed hereinbefore.

Based on the above, in the TFT array substrate of an embodiment of the present invention, the locations of the source region and the drain region in the TFT are adjusted corresponding to the position of the gate. Thereby, a migration path of carriers in the channel region crosses a plurality of SGBs. On the other hand, the shape of the channel region in the TFT is adjusted according to another embodiment, such that the migration path of the carriers in the channel region crosses a plurality of SGBs. As such, the TFTs on the TFT array substrate of the present invention feature the uniform electrical properties. Moreover, the TFT array substrate characterized by the uniform electrical properties is formed by applying the method for forming the TFT array substrate according to the present invention.

In order to make the aforementioned and other features and advantages of the present invention be more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 4A and 4B are schematic views illustrating a crystallization form in a semiconductor film of the TFT according to the first embodiment of the present invention.

FIGS. 8A and 8B show electrical performance of the TFT array substrate according to the present invention.

DESCRIPTION OF EMBODIMENTS

First Embodiment

Figure 1:
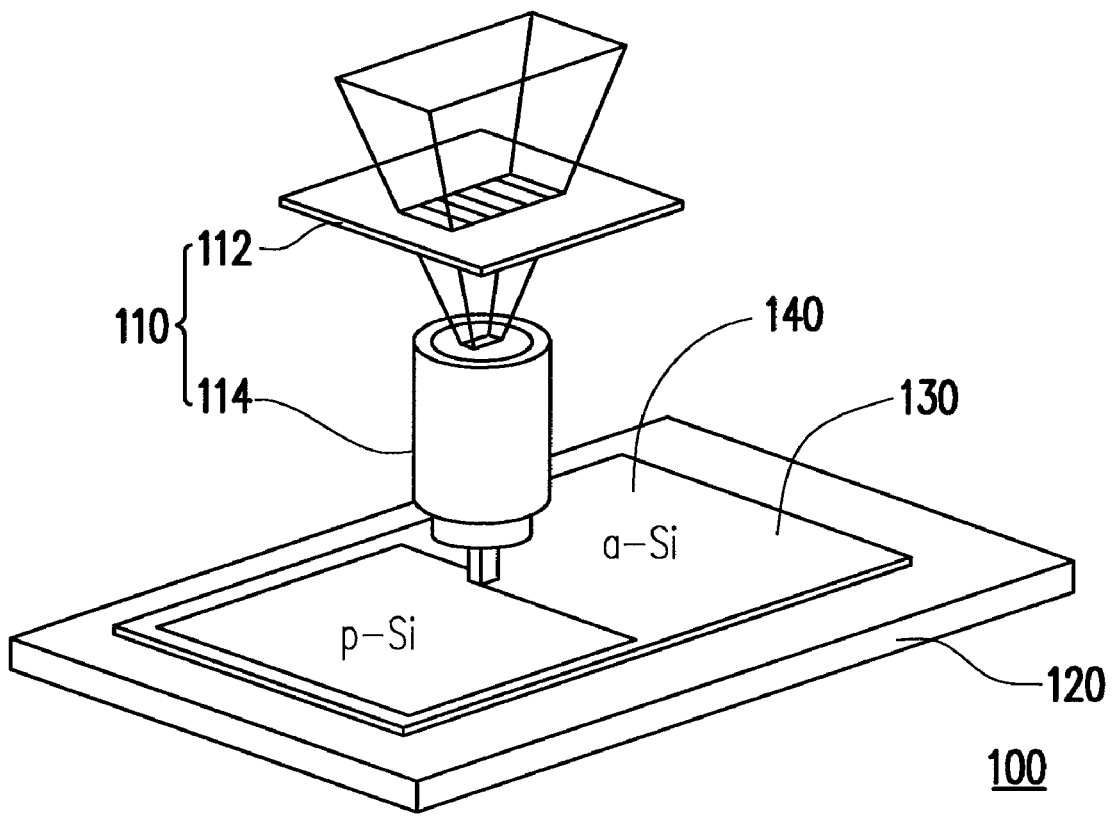
FIG. 1 is a schematic view of a conventional SLS laser crystallization apparatus.
Figures 2A, 2B:
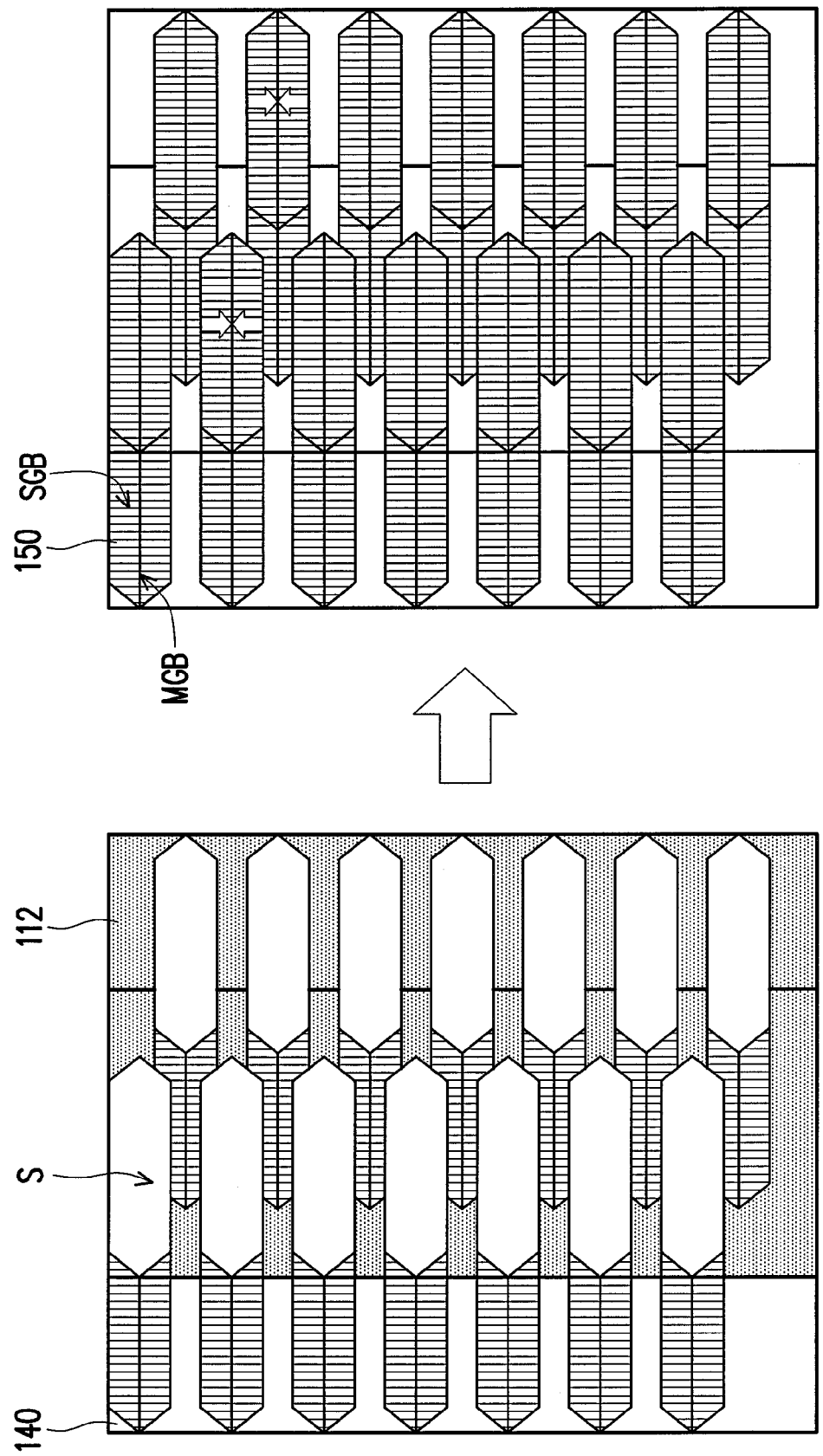
FIG. 2A is a schematic view of a conventional SLS laser crystallization apparatus in which crystallization is being performed on a polysilicon layer.
FIG. 2B is a schematic top view of the polysilicon layer fabricated by performing the crystallization as shown in FIG. 2A.
Figure 3:
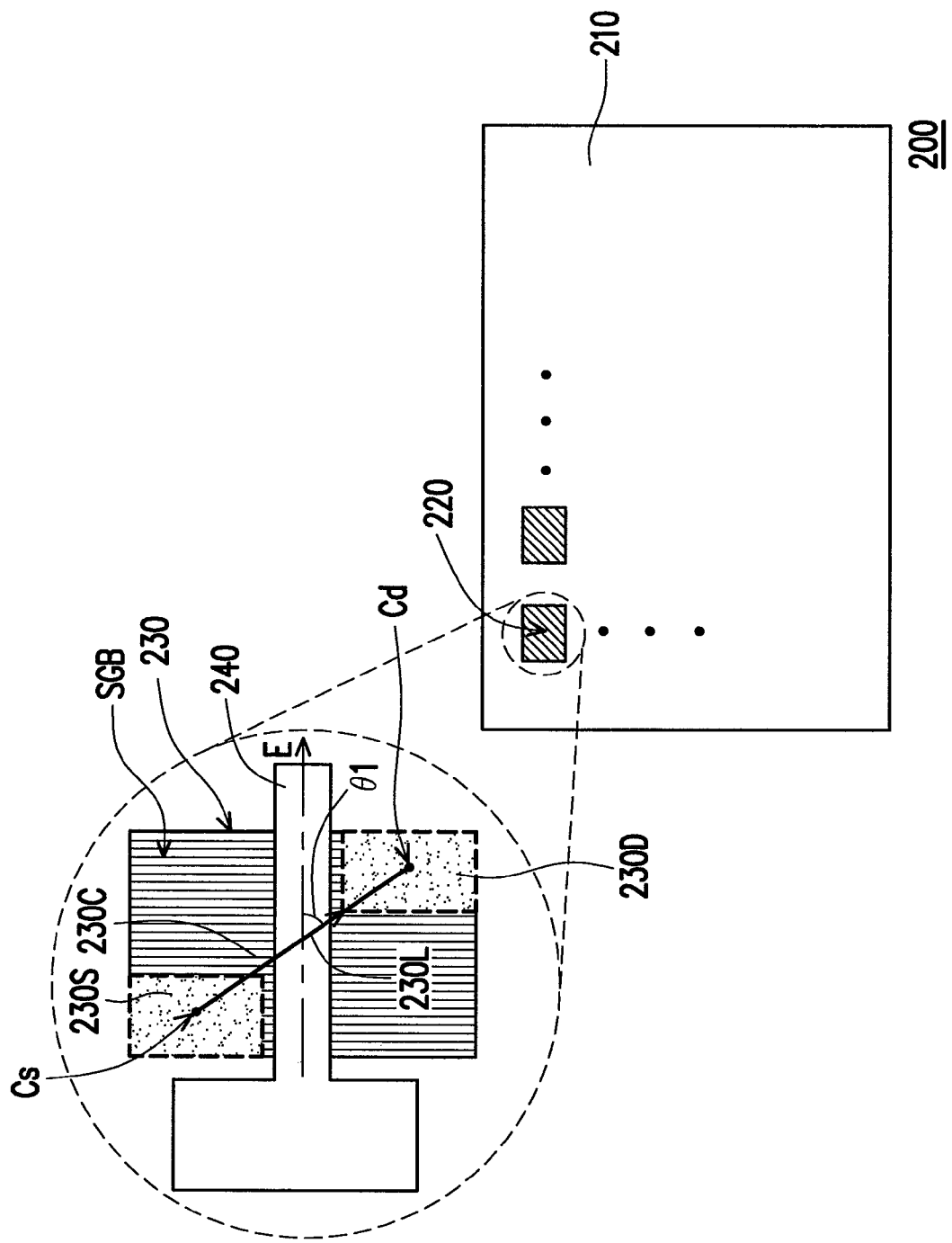
FIG. 3 illustrates a schematic top view of a TFT array substrate according to a first embodiment of the present invention and a partial enlarged view of said TFT array substrate.

FIG. 3 illustrates a schematic top view of a TFT array substrate according to a first embodiment of the present invention and a partial enlarged view of said TFT array substrate. Referring to FIG. 3, a TFT array substrate 200 includes a substrate 210 and at least a TFT 220 disposed on the substrate 210. The TFT 220 includes a semiconductor island 230 and at least a gate 240. The semiconductor island 230 includes a source region 230S, a drain region 230D, and a channel region 230C positioned between the source region 230S and the drain region 230D. Here, the semiconductor island 230 can be made of poly-crystalline silicon, mono-crystalline silicon, or micro-crystalline silicon. In an alternative, the semiconductor island 230 can be made of a poly-crystalline compound containing silicon and at least one of germanium, arsenide, and gallium, a mono-crystalline compound containing the same, or a micro-crystalline compound containing the same. The material of the semiconductor island 230 can also be selected from a poly-crystalline compound containing silicon and at least two of germanium, arsenide, and gallium, a mono-crystalline compound containing the same, or a micro-crystalline compound containing the same. Note that any other poly-crystalline compound with appropriate components, any other mono-crystalline compound with appropriate components, or any other micro-crystalline compound with appropriate components can also be used to form the semiconductor island 230. In the present embodiment, the semiconductor island 230 is made of polysilicon, which should not be construed as limited to the present invention. The substrate 210 is, for example, made of an inorganic transparent material (e.g., glass, quartz, other appropriate materials, or a combination thereof), an organic transparent material (e.g., polyolefin, polythiourea, polyalcohols, polyester, rubber, a thermoplastic polymer, a thermosetting polymer, polyarylene, polymethylmethacrylate, plastic, polycarbonate, other appropriate materials, derivatives thereof, or a combination thereof), or a combination thereof. According to the present embodiment, the substrate 210 is made of glass, which is not limited in the present invention. The gate 240 corresponds to the channel region 230C, such that a turn-on state or a turn-off state of the TFT 220 can be controlled. In the present embodiment, the gate 240, the channel region 230C, the source region 230S, and the drain region 230D together constitute the TFT 220 with a top-gate structure. However, in other embodiments, the gate 240 can be correspondingly disposed below the channel region 230C, so as to form a bottom-gate TFT 220. Additionally, based on actual demands, the number of the gate 240 can be increased to two, three, and so on, which is not limited in the present invention. Note that a first included angle θ1 is formed between an extending direction E of the gate 240 and a line 230L connecting the centroid Cs of the source region 230S with the centroid Cd of the drain region 230D as shown in the top view of FIG. 3, and the first included angle θ1 is not substantially equal to 90 degrees. In the present embodiment, the gate 240 located between the source region 230S and the drain region 230D, and the gate 240 has a bar shape and the extending direction E of the gate 240 is a length direction of the gate 240, as an example.

FIGS. 4A and 4B are schematic views illustrating a crystallization form in a semiconductor film layer of the TFT according to the first embodiment of the present invention. Specifically, FIGS. 4A and 4B illustrate the grain orientation in the semiconductor film layer after crystallization is performed but before the semiconductor film layer is patterned. Referring to FIGS. 4A and 4B, the semiconductor island 230 has a plurality of SGBs, and MGBs are substantially perpendicular to the SGBs. Note that a second included angle θ2 is formed between the SGB in the channel region 230C and the line 230L connecting the centroid Cs of the source region 230S with the centroid Cd of the drain region 230D. Here, the second included angle θ2 is not substantially equal to 0 degree or 90 degrees and substantially ranges from 10 degrees to 80 degrees, for example. It should be mentioned that the MGBs herein refer to protrusions formed on a surface of a polysilicon island during the growth of the grains, while the SGBs mostly refer to cavities on the surface of the polysilicon island.

In particular, as shown in FIG. 4A, the SGBs in the channel region 230C are substantially parallel to a direction of a width 240W of the gate 240. With reference to the extending direction E of the gate 240, the locations of the source region 230S and the drain region 230D are designed to be asymmetric to the extending direction E according to the present invention. Thereby, the line 230L connecting the centroid Cs of the source region 230S with the centroid Cd of the drain region 230D and the extending direction E are not substantially orthogonal to each other and together form the first included angle θ1. A migration path of carriers in the channel region 230C is in substance parallel to the line 230L connecting the centroid Cs of the source region 230S with the centroid Cd of the drain region 230D. That is to say, the migration path of the carriers in the channel region 230C crosses a plurality of SGBs. As such, electrical performance of the TFT 220 is affected to a less extent by anisotropic effects resulted from the crystallization form of the polysilicon layer, and uniformity of electrical properties of the TFT 220 on the TFT array substrate 200 is improved.

On the other hand, as indicated in FIG. 4B, the SGBs in the channel region 230C are substantially parallel to a direction of a length 240L of the gate 240. Besides, the line 230L connecting the centroid Cs of the source region 230S with the centroid Cd of the drain region 230D and the extending direction E are not substantially orthogonal to each other and together form the first included angle θ1. Likewise, the migration path of the carriers in the channel region 230C crosses a plurality of SGBs. Thereby, the electrical performance of the TFT 220 can also be affected to a less extent by the anisotropic effects resulted from the crystallization form of the polysilicon layer, and the uniformity of the electrical properties of the TFT 220 is improved as well.

Figure 5:
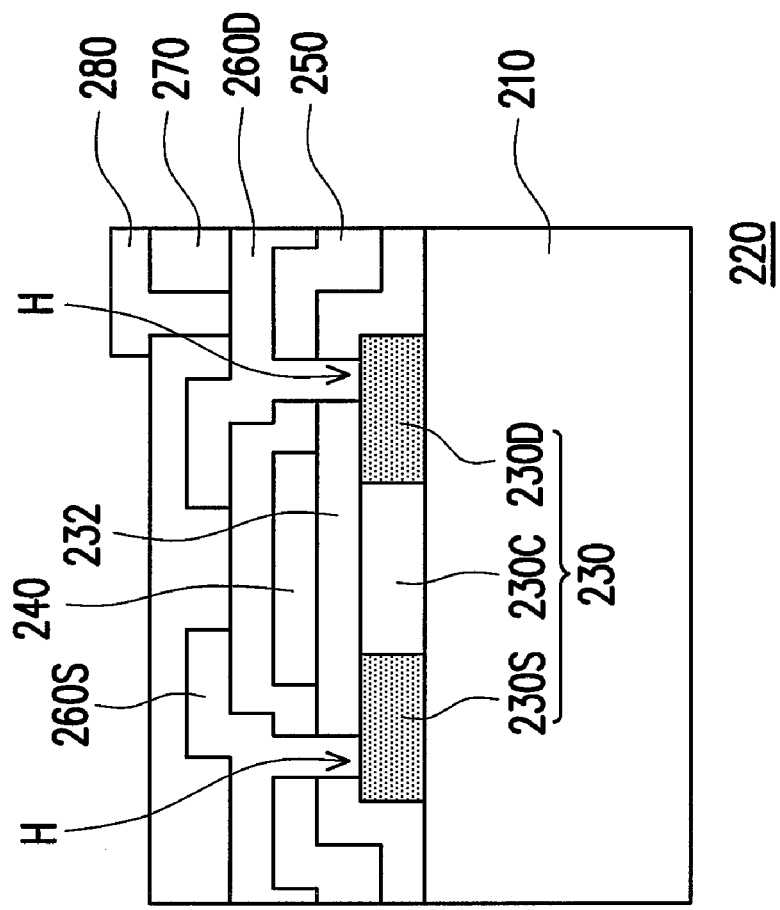
FIG. 5 is a schematic cross-sectional view of a TFT on the TFT array substrate according to the first embodiment of the present invention.

FIG. 5 is a schematic cross-sectional view of a TFT on the TFT array substrate according to the first embodiment of the present invention. Referring to FIG. 5, practically speaking, a gate insulation layer 232 can be further disposed between the gate 240 and the semiconductor layer 230 in the TFT 220. Meanwhile, a dielectric layer 250 can also be formed to cover the gate 240 and the gate insulation layer 232 on the TFT array substrate 200. Here, the dielectric layer 250 has a plurality of openings H, for example. In addition, a source 260S and a drain 260D can be selectively disposed on the dielectric layer 250. Here, the source 260S is electrically connected to the source region 230S of the semiconductor island 230, and the drain 260D is electrically connected to the drain region 230D of the semiconductor island 230. Moreover, in the present embodiment, the TFT array substrate 200 further includes a plurality of pixel electrodes 280 electrically connected to the drain 260D. A passivation layer 270 can be selectively disposed on the source 260S and the drain 260D and expose the drain 260D according to the present embodiment. By contrast, in another embodiment, given that the TFT 220 has the bottom-gate structure, the gate 240 is correspondingly disposed below the channel region 230C, and the gate insulation layer 232 is disposed between the gate 240 and the semiconductor island 230. In addition, the source 260S and the drain 260D can be selectively disposed. Here, the source 260S is electrically connected to the source region 230S of the semiconductor island 230, and the drain 260D is electrically connected to the drain region 230D of the semiconductor island 230. Moreover, in the present embodiment, the TFT array substrate 200 further includes a plurality of pixel electrodes 280 electrically connected to the drain 260D. The passivation layer 270 can be selectively disposed on the source 260S and the drain 260D and expose the drain 260D according to the present embodiment.

A method for fabricating the TFT array substrate of FIG. 3 includes following steps, for example. A substrate 210 is provided at first. Next, at least a semiconductor island 230 is formed on the substrate 210, and the semiconductor island 230 includes a plurality of SGBs. Thereafter, a source region 230S, a drain region 230D, and a channel region 230C disposed between the source region 230S and the drain region 230D are defined in the at least a semiconductor island 230. After that, at least a gate 240 corresponding to the channel region 230C is formed, so as to obtain a first included angle θ1 and a second included angle θ2. The first included angle θ1 between an extending direction E of the gate 240 and a line 230L connecting the centroid Cs of the source region 230S with the centroid Cd of the drain region 230D is not substantially equal to 90 degrees. The second included angle θ2 between the SGB in the channel region 230C and the line 230L connecting the centroid Cs of the source region 230S with the centroid Cd of the drain region 230D is not substantially equal to 0 degree or 90 degrees.

Based on a layout space of the substrate 210, physical dimensions of products, and requirements for the electrical properties of the TFT 220, the first included angle θ1 and the second included angle θ2 can be adjusted, so as to allow the TFT array substrate 220 to be equipped with the uniform electrical properties and satisfactory carrier mobility. Several TFT array substrates having structures compliant with the concept of the present invention and fabricating methods of these TFT array substrates are further described hereinafter.

Second Embodiment

Figure 6:
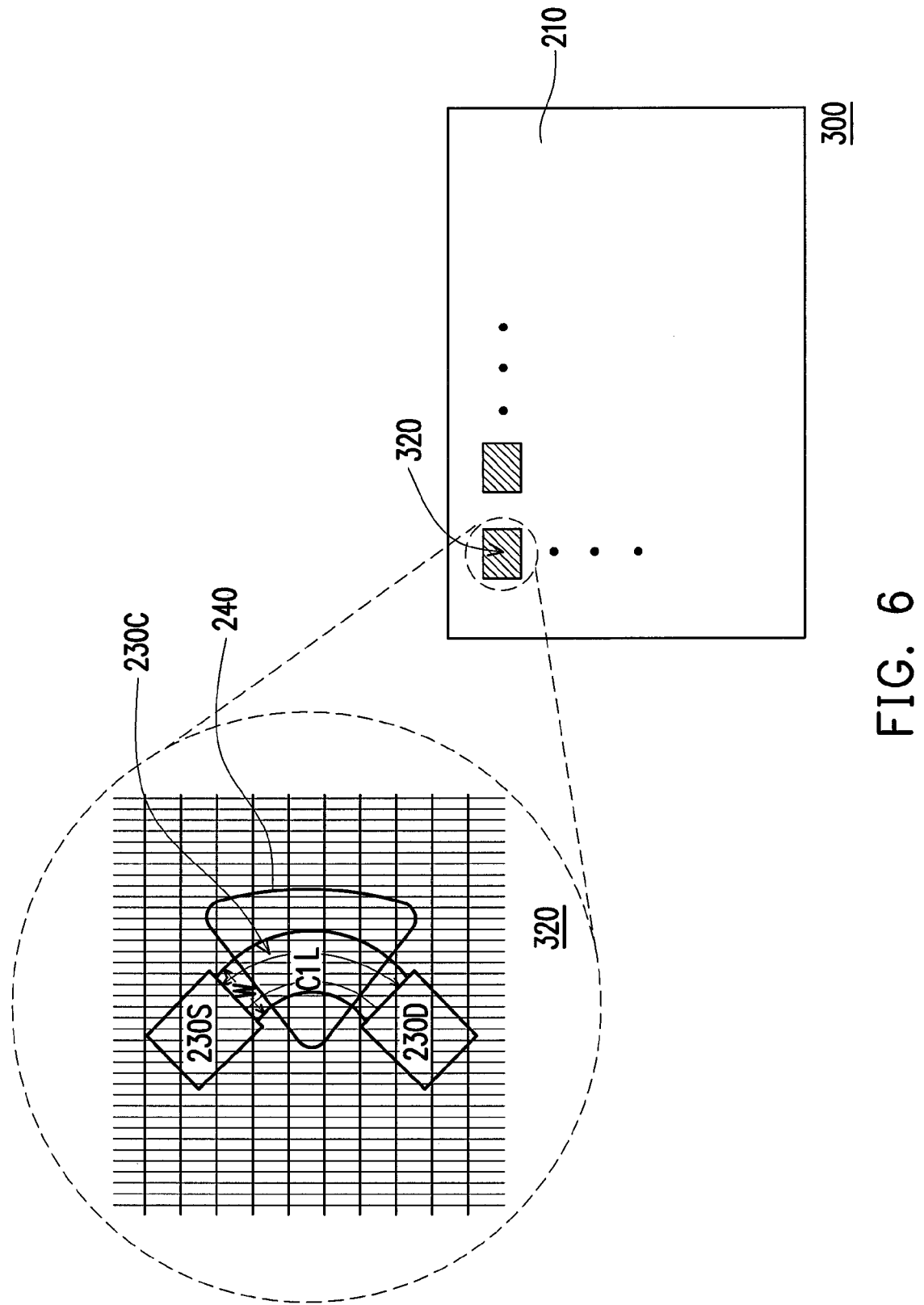
FIG. 6 illustrates a schematic top view of a TFT array substrate according to a second embodiment of the present invention and a partial enlarged view of said TFT array substrate.

FIG. 6 illustrates a schematic top view of a TFT array substrate according to a second embodiment of the present invention and a partial enlarged view of said TFT array substrate. Referring to FIG. 6, a TFT array substrate 300 includes a substrate 210 and at least a TFT 320 disposed on the substrate 210. The TFT 320 includes a semiconductor island 230 and a gate 240. The semiconductor island 230 has a plurality of SGBs. Besides, the semiconductor island 230 includes a source region 230S, a drain region 230D, and a channel region 230C positioned between the source region 230S and the drain region 230D. The gate 240 corresponds to the channel region 230C. The material of the semiconductor island 230, the material of the substrate 210, and the corresponding arrangement of the gate 240 and the channel region 230C are similar to those described in the first embodiment, and the TFT 320 herein has a top-gate structure, for example. Hence, no further descriptions are provided herein. In other embodiments, the gate 240 can also be correspondingly disposed below the channel region 230C, so as to constitute a bottom-gate TFT. Additionally, based on actual demands, the number of the gate 240 can be increased to two, three, and so on, which is not limited in the present invention. In comparison with the TFT 220 of the previous embodiment, it should be noted that the length of the channel region 230C in the TFT 320 of the present embodiment is extended along a curve C1 as shown in the top view of FIG. 6, and the width W of the channel region 230C remains substantially the same in an extending direction of the curve C1. Besides, the shape of the gate 240 is substantially identical to the shape of the channel region 230C in the present embodiment, preferably. It is certain that the gate 240 can have a bar shape as well. The shape of the gate 240 is not limited in the present invention.

It should be mentioned that the carriers in the channel region 230C are in substance moved along a direction of a length L of the channel region 230C, and the length L of the channel region 230C is substantially equal to the total length of the curve C1 in the channel region 230C. Therefore, as shown in FIG. 6, the migration path of the carriers in the channel region 230C crosses a plurality of SGBs, and the anisotropic electrical properties caused by the crystallization form of the polysilicon layer in different channel regions of the TFT 320 can be reduced according to the present embodiment. Further, the uniformity of the electrical properties of the TFT 320 is improved as well.

Figure 7A:
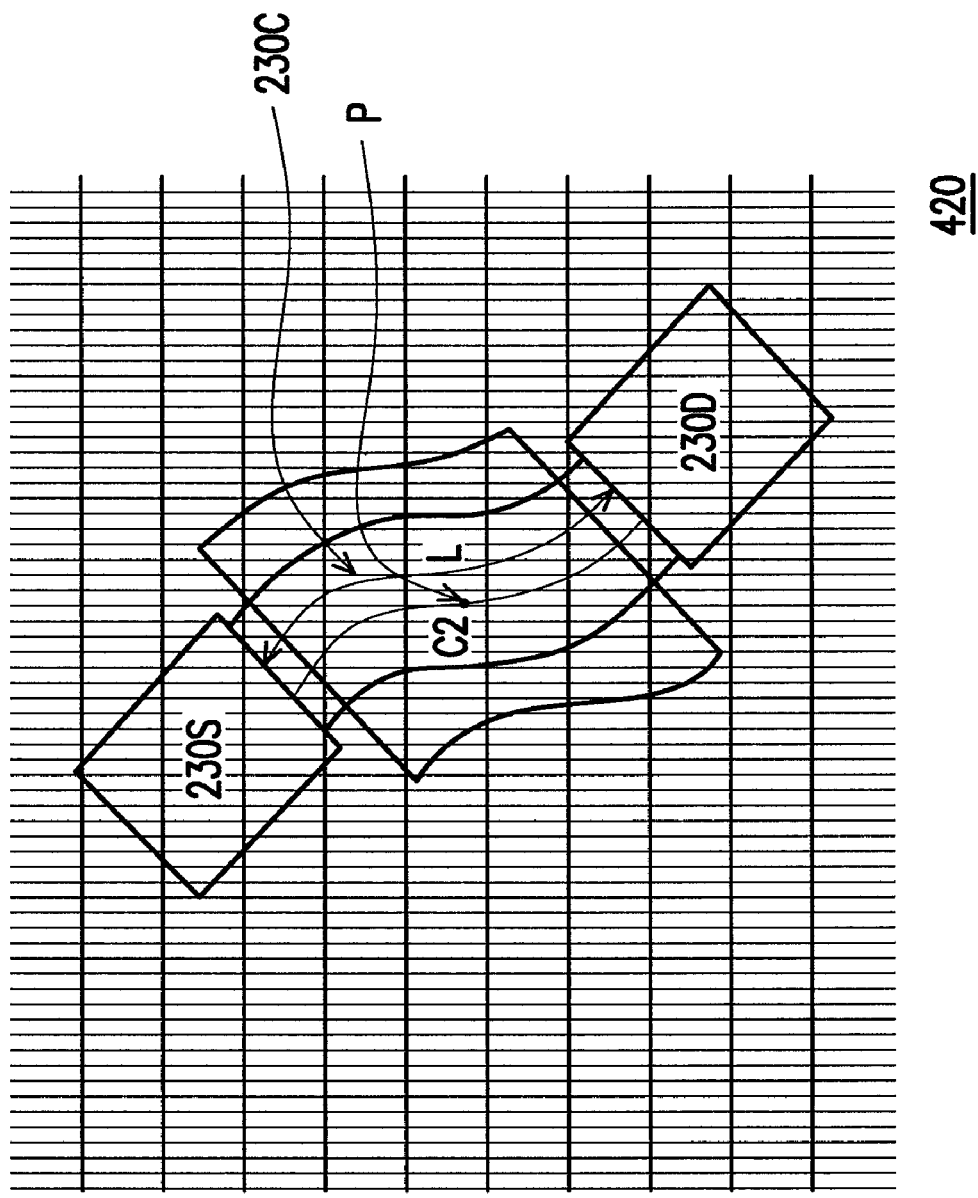
FIG. 7A is a schematic top view of another TFT on the TFT array substrate according to the second embodiment of the present invention.

FIG. 7A is a schematic top view of another TFT on the TFT array substrate according to the second embodiment of the present invention. Referring to FIG. 7A, the length of a channel region 230C in a TFT 420 is extended along a curve C2. In the present embodiment, the curve C2 has an inflection point P, and the width W of the channel region 230C remains substantially the same in an extending direction of the curve C2.

Figure 7B:
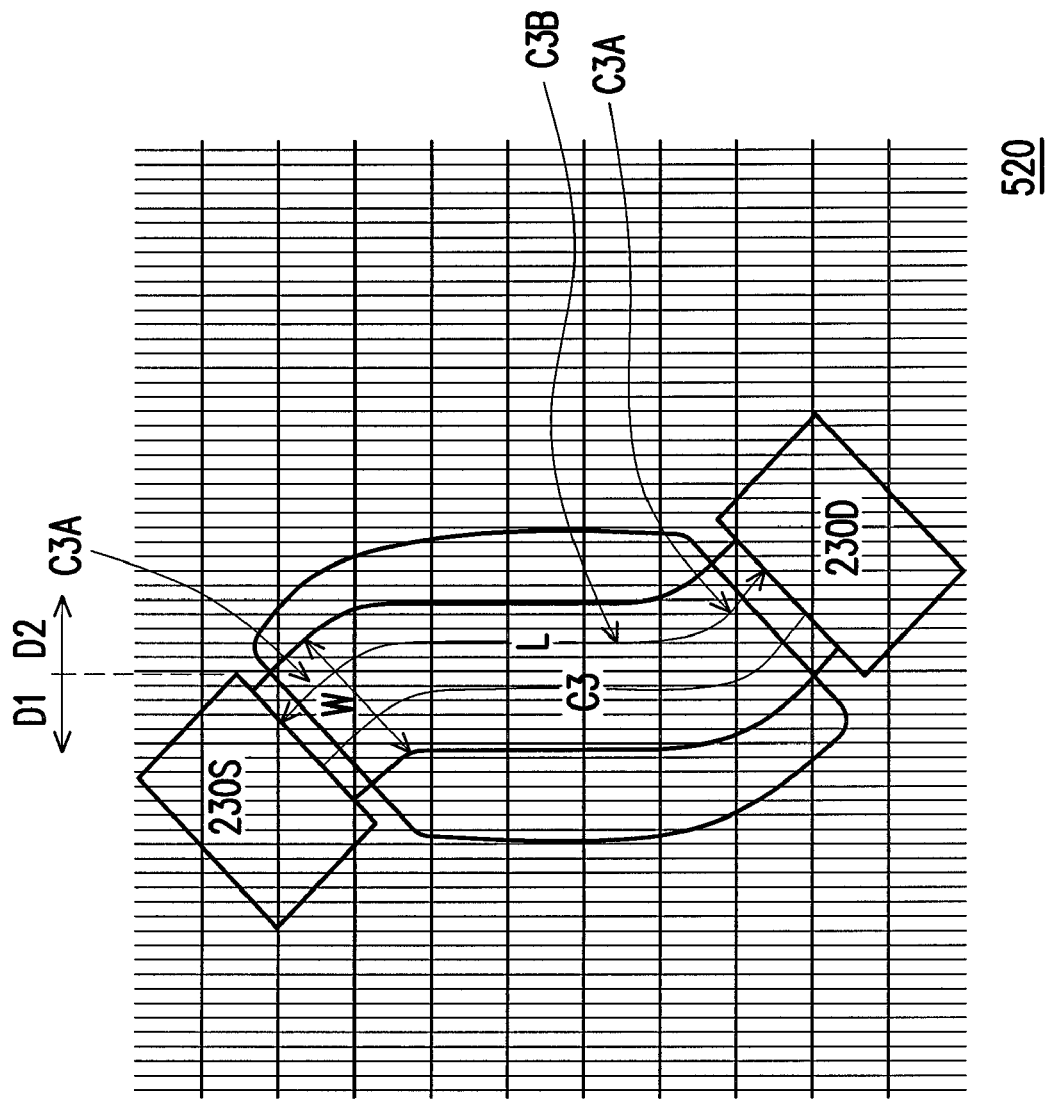
FIGS. 7B and 7C are schematic top views of still another TFT on the TFT array substrate according to the second embodiment of the present invention.
Figure 7C:
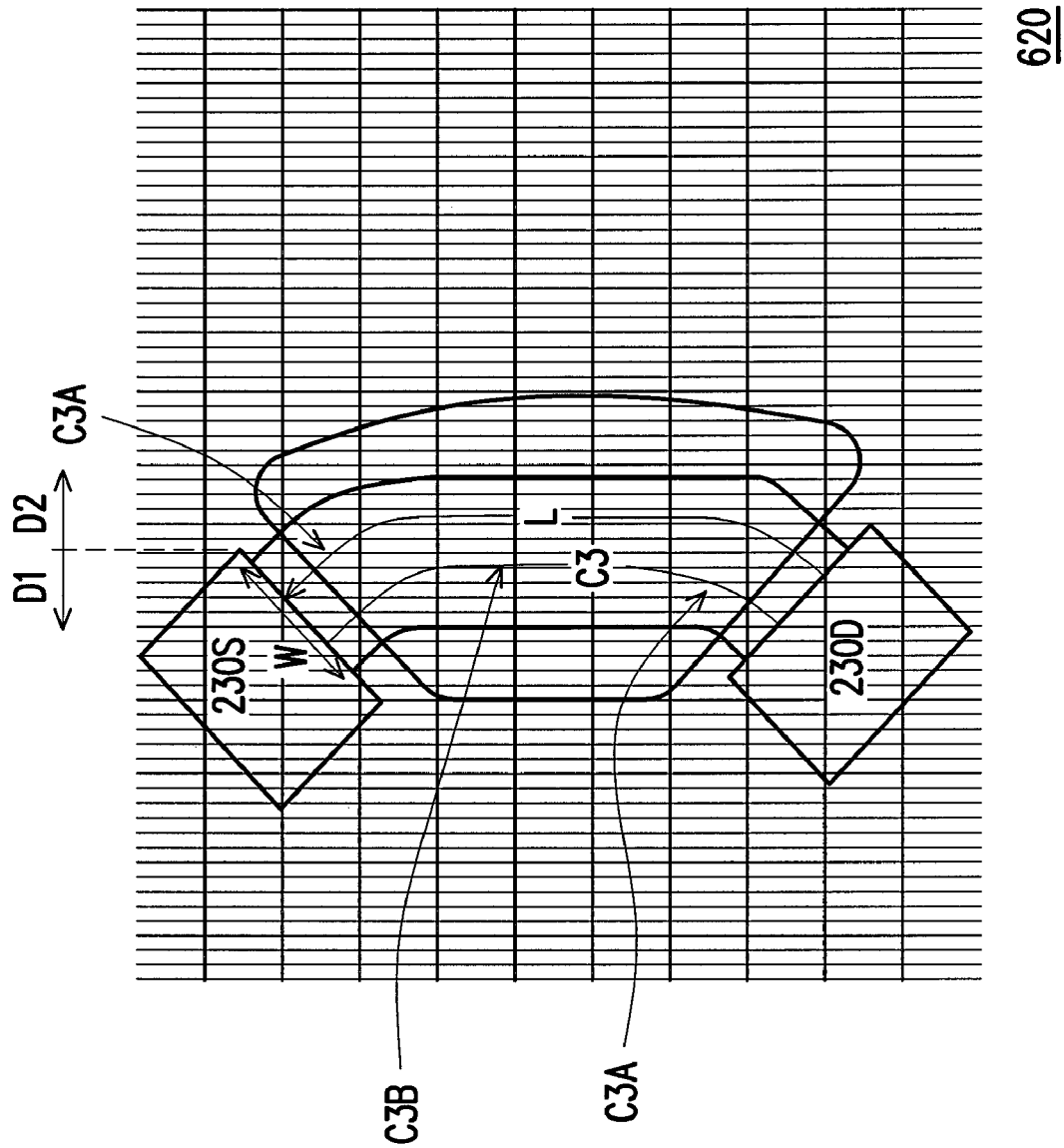

Certainly, the layout of the channel region 230C in the TFT 420 can also be designed as shown in FIGS. 7B and 7C. Referring to FIGS. 7B and 7C, the length of the channel region 230C in TFTs 420 and 520 is extended along a curve C3, and the width W of the channel region 230C remains substantially the same in an extending direction of the curve C3. In the present embodiment, the curve C3 includes two curved ends C3A and a straight portion C3B that is connected between the two curve ends C3A. The two curved ends C3A are adjacent to the source region 230S and the drain region 230D, respectively In addition, the SGBs are substantially parallel to an extending direction of the straight portion C3B in the channel region 230C extended along the straight portion C3B. As shown in FIG. 7B, note that the two curved ends C3A can be bent in different directions (directions D1 and D2 in FIG. 7B) with reference to the straight portion C3B serving as a baseline. Certainly, as shown in FIG. 7C, the two curved ends C3A can also be bent in the same direction (a direction D1 in FIG. 7C) with reference to the straight portion C3B serving as the baseline. Moreover, in other embodiments, the two curved ends C3A can also be bent in the same direction (a direction D2 in FIG. 7C) with reference to the straight portion C3B serving as the baseline, which is not limited in the present invention.

As indicated in FIGS. 6~7C, the channel region in the TFT does not have a simple rectangular shape, and the values of the included angles between the MGBs and the SGBs in the semiconductor film layer at different positions of the entire channel region do not stay unchanged. Thereby, the migration path of the carriers in the channel region 230C crosses a plurality of SGBs, and the uniformity of the electrical properties of the TFTs 320, 420, 520, and 620 on the TFT array substrate 300 is improved. FIGS. 8A and 8B show electrical performance of the TFT array substrate according to the present invention. Referring to FIGS. 8A and 8B, the TFT array substrate of the present invention achieves better uniformity of the electrical properties than the conventional TFT array substrate does. In detail, directions of channel regions in some TFTs 20P of the conventional TFT array substrate are simply and only parallel to the SGBs, while directions of channel regions in other TFTs 20V of the conventional TFT array substrate are simply and only perpendicular to the SGBs. In the conventional TFTs 20P and 20V indicated in FIGS. 8A and 8B, a line connecting the centroid of a source region with the centroid of a drain region is perpendicular (orthogonal) to an extending direction of a gate, while the line connecting the centroid of the source region with the centroid of the drain region are parallel to or perpendicular to the SGBs. Therefore, it is known from the above that the electrical performance varies to a great extent, and the electrical properties are not sufficiently uniform. Referring to FIGS. 8A and 8B, on the TFT array substrate 300 of the present invention, TFTs 720V and 720P are arranged to be in different directions. The layout of the TFT 720V is the layout of the TFT 720P rotated by 90 degrees. According to the present invention, the shape of the channel region 230C is specifically designed as provided above. Thereby, the anisotropic electrical effects can be decreased when the SGBs on the semiconductor island 230 and the channel regions are arranged in different directions. Moreover, the variations in the electrical performance between the TFT 720V and the TFT 720P are reduced, and the uniformity of the electrical properties of the TFTs 720V and 720P on the TFT array substrate 300 is significantly improved. Here, the TFTs 720P and 720V refer to at least one of the aforesaid TFTs 320, 420, 520, and 620 provided in the previous embodiment.

Since the layout design of the TFT array substrate can be determined upon product demands, a requirement for a layout space of the substrate, or other demands, the TFTs disposed at different locations of the TFT array substrate can be designed to have the channel regions in different directions. Since the layout design of the TFT array substrate can be determined upon product demands, a requirement for a layout space of the substrate, or other demands. Moreover, in some cases, even though the directions of the channel regions in the TFTs on the TFT array substrate are the same, electrical variations caused by process errors, for example, including an optical offset in radial directions in a photolithography process can be suppressed according to the present invention. Because the shape of the channel region in the TFT enables the migration path of the carriers in the channel region to cross a plurality of SGBs and MGBs, the layout of the TFT can be less restricted by the crystallization form in the polysilicon film layer. As a result, the uniformity of the electrical properties of the TFT array substrate is further improved.

Further, a method for fabricating the TFT array substrate 300 depicted in FIG. 6 includes following steps, for example. A substrate 210 is provided at first. Next, at least a semiconductor island 230 is formed on the substrate 210, and the semiconductor island 230 includes a plurality of SGBs. Thereafter, a source region 230S, a drain region 230D, and a channel region 230C located between the source region 230S and the drain region 230D are defined in the at least a semiconductor island 230. The length of the channel region 230C is extended along a curve C1, and the width W of the channel region 230C remains substantially the same in an extending direction of the curve C1. Afterwards, at least a gate 240 corresponding to the channel region 230C is formed.

Figure 9:
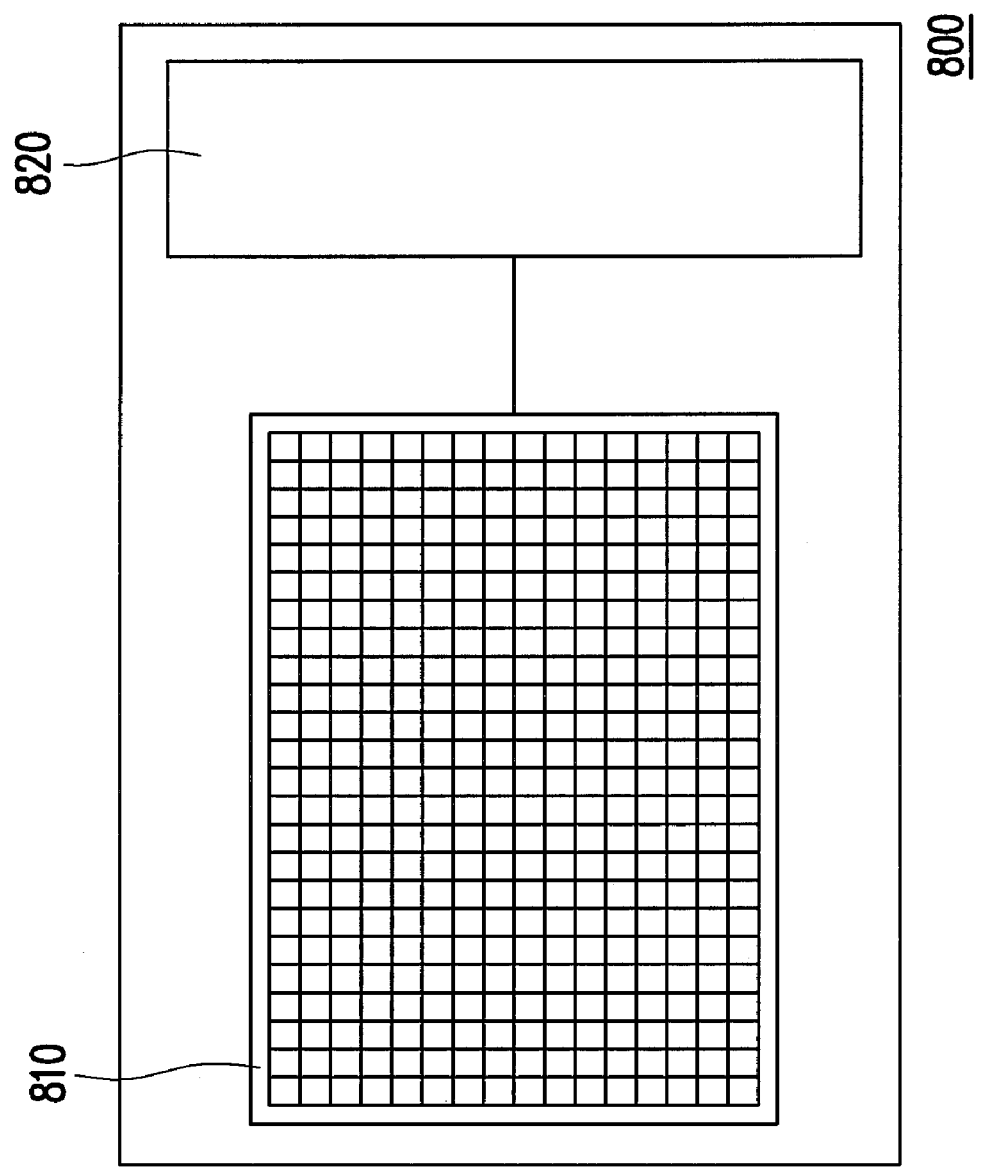
FIG. 9 is a schematic view of an electronic apparatus according to an embodiment of the present invention.

FIG. 9 is a schematic view of an electronic apparatus according to an embodiment of the present invention. Referring to FIG. 9, an electronic apparatus 800 includes a display panel 810 and an electronic component 820 electrically connected to the display panel 810. The display panel 810 includes at least one of the TFT array substrate 200 and the TFT array substrate 300 as provided hereinbefore. Therefore, a method for fabricating the display panel 810 includes a method for fabricating the TFT array substrate 200 and a method for fabricating the TFT array substrate 300, for example. The TFT array substrates 200 and 300 are characterized by favorable display quality and can be easily driven. Thus, the electronic apparatus 800 also has the aforesaid advantages. Certainly, the TFT array substrate in the display panel 810 can also be selected from other TFT array substrates designed in compliance with the concept of the present invention and is thus not limited herein.

To be more specific, the display panel 810 can be classified into various types based on different display modes, different materials and designs of the pixel electrodes, different designs of film layers, and different display media. The most common display panel 810 includes a transmissive display panel, a transflective display panel, a reflective display panel, a color-filter-on-array display panel, an array-on-color-filter display panel, a vertical alignment (VA) display panel, a in-plane-switch (IPS) display panel, an multi-domain vertical alignment (MVA) display panel, a twist nematic (TN) display panel, a super twist nematic (STN) display panel, a patterned-silt vertical alignment (PVA) display panel, a super patterned-silt vertical alignment (S-PVA) display panel, an advance super view (ASV) display panel, a fringe field switching (FFS) display panel, a continuous pinwheel alignment (CPA) display panel, an axially symmetric aligned micro-cell mode (ASM) display panel, an optical compensation banded (OCB) display panel, a super in plane switching (S-IPS) display panel, an advanced super in-plane-switching (AS-IPS) display panel, an ultra-fringe field switching (UFFS) display panel, a polymer stabilized alignment (PSA) display panel, a dual-view display panel, a triple-view display panel, a three-dimensional display panel, any other display panel, or a combination thereof. Here, the display panel 810 is also referred to as a non-self illuminating display panel. In contradistinction, given that the display medium is made of an electro-luminescent material, the display panel is referred to as a self-illuminating display panel. Additionally, if the display medium includes both a liquid crystal material and the electro-luminescent material, the display panel is referred to as a hybrid display panel or a semi-self-illuminating display panel. Similarly, if the display medium is made of the liquid crystal material and the electro-luminescent material is disposed within a pixel region or below the display panel, the display panel can also be referred to as the hybrid display panel or the semi-self-illuminating display panel.

On the other hand, the electronic apparatus 820 includes a control device, an operating device, a treatment device, an input device, a memory device, a driving device, a light emitting device, a protection device, a sensing device, a detecting device, other devices having other functions, or a combination thereof. As a whole, the electronic apparatus 800 includes a portable product (e.g. a mobile phone, a camcorder, a camera, a laptop computer, a game player, a watch, a music player, an e-mail receiver and sender, a map navigator, a digital picture, or the like), an audio-video product (e.g. an audio-video player or the like), a screen, a television, a bulletin, a dashboard, a panel in a projector, and so on.

Moreover, the centroid discussed in the above embodiment indicates that the top view of a depicted object is taken from the center of the object rather than the corner thereof or an angle area thereof. In addition, the gate 240 is disposed on the semiconductor island 230 in the TFT 220 according to the embodiments of the present invention, which is not limited herein. Namely, in other embodiments, the structure and the fabricating method of the TFT 220 of the present invention are also applicable when the gate 240 is disposed below the semiconductor island 230. That is to say, the gate 240 is formed on the substrate 210, and the gate 240 and the substrate 210 are then covered by the gate insulation layer 232. Next, the semiconductor island 230 is disposed on a portion of the gate insulation layer 232. The relevant designs of the semiconductor island 230 and the gate 240 are similar to those disclosed in the above embodiment, and therefore no further description is provided herein.

Besides, the passivation layer 270 can selectively cover the semiconductor island 230. In the present embodiment, the semiconductor island 230 is covered by the passivation layer 270, which is not limited in the present invention.

The source 260S and the drain 260D are then disposed on a portion of the passivation layer 270, such that the source 260S and the drain 260D are electrically connected to the source region 230S and the drain region 230D in the semiconductor island 230, respectively. Other relevant descriptions are similar to those disclosed in the previous embodiment. Based on the above, the gate 240 and the semiconductor island 230 are disposed on the substrate 210, and the gate 240 corresponds to the channel region 230C of the semiconductor island 230 and is located below the semiconductor island 230 according to the present embodiment. The relevant designs of the semiconductor island 230 and the gate 240 are similar to those described in the previous embodiment, and thus no further description is provided herein.

In addition, when the TFT has vertically-arranged gates therein, i.e., a top gate disposed above the semiconductor island and a bottom gate disposed below the semiconductor island, the designs of the semiconductor island and at least one of the gates are also similar to those described in the previous embodiment. In an alternative, when the TFT has horizontally-arranged gates therein, i.e., two or more gates on the same plane, the designs of the semiconductor island and at least one of the gates are also similar to those described in the previous embodiment. Here, the gates on the same plane can be disposed above or below the semiconductor island.

To sum up, the TFT substrate, the electronic apparatus, and the methods for fabricating said TFT substrate and said electronic apparatus in the present invention at least include the following advantages in whole or in part:

(1) The first included angle is formed between the extending direction of the gate and the line connecting the centroid of the source region with the centroid of the drain region, and the extending direction of the gate and said line are not orthogonal. Besides, the second included angle formed between the SGB in the channel region and the line connecting the centroid of the source region with the centroid of the drain region is not substantially equal to 0 degree or 90 degrees. As such, the migration path of the carriers in the channel region crosses a plurality of SGBs, which can suppress the electrical variations of TFT and improve the uniformity of the electrical properties of the TFT array substrate.

(2) The length of the channel region in the TFT is extended along a curve, and thereby the migration path of the carriers in the channel region crosses a plurality of SGBs. As such, the uniformity of the electrical properties of the TFT on the TFT array substrate can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor substrate, comprising:
   a substrate;
   at least a thin film transistor, disposed on the substrate and comprising:
      a semiconductor island, comprising a source region, a drain region, and a channel region disposed between the source region and the drain region, the semiconductor island further comprising a plurality of sub-grain boundaries; and
      at least a gate, corresponding to the channel region, wherein a first included angle between an extending direction of the gate and a line connecting the centroid of the source region with the centroid of the drain region is not substantially equal to 90 degrees, and a second included angle between the sub-grain boundaries and the line connecting the centroid of the source region with the centroid of the drain region is not substantially equal to 0 degree or 90 degrees.

2. The thin film transistor substrate of claim 1, wherein the first included angle substantially ranges from 10 degrees to 80 degrees.

3. The thin film transistor substrate of claim 1, wherein the second included angle substantially ranges from 10 degrees to 80 degrees.

4. The thin film transistor substrate of claim 1, wherein the gate located between the source region and the drain region has a bar shape, and the extending direction of the gate is a length direction of the gate.

5. The thin film transistor substrate of claim 1, wherein the sub-grain boundaries in the channel region are substantially parallel to a width direction of the gate.

6. The thin film transistor substrate of claim 1, wherein the sub-grain boundaries in the channel region are substantially parallel to a length direction of the gate.

7. A method for fabricating a thin film transistor substrate, the method comprising:
   providing a substrate;
   forming at least a semiconductor island on the substrate, the at least a semiconductor island comprising a plurality of sub-grain boundaries;
   defining a source region, a drain region, and a channel region disposed between the source region and the drain region in the semiconductor island;
   forming at least a gate corresponding to the channel region, so as to obtain a first included angle and a second included angle, wherein the first included angle between an extending direction of the gate and a line connecting the centroid of the source region with the centroid of the drain region is not substantially equal to 90 degrees, and the second included angle between the sub-grain boundaries in the channel region and the extending direction of the gate is not substantially equal to 0 degree or 90 degrees.

8. An electronic apparatus comprising a display panel and an electronic component connected to the display panel, wherein the display panel comprises the thin film transistor substrate of claim 1.

9. A method for fabricating an electronic apparatus, the method comprising providing a display panel and an electronic component connected to the display panel, wherein a method for fabricating the display panel comprises a method for fabricating the thin film transistor substrate of claim 1.

* * * * *